US008212267B2

(12) United States Patent
Oosako

(10) Patent No.: US 8,212,267 B2
(45) Date of Patent: Jul. 3, 2012

(54) ORGANIC ELECTROLUMINESCENCE ELEMENT AND MANUFACTURING METHOD THEREOF

(75) Inventor: Takashi Oosako, Kyoto (JP)

(73) Assignee: Panasonic Corporation, Osaka (JP)

(*) Notice: Subject to any disclaimer, the term of this patent is extended or adjusted under 35 U.S.C. 154(b) by 126 days.

(21) Appl. No.: 12/912,347

(22) Filed: Oct. 26, 2010

(65) Prior Publication Data

US 2011/0108859 A1  May 12, 2011

Related U.S. Application Data

(63) Continuation of application No. PCT/JP2009/006026, filed on Nov. 11, 2009.

(51) Int. Cl.
*H01L 29/18* (2006.01)
(52) U.S. Cl. .............. 257/88; 257/89; 257/E51.022
(58) Field of Classification Search .............. 257/40, 257/87, 88, 89, E51.022, E51.017, E51.046; 438/82, FOR. 135
See application file for complete search history.

(56) References Cited

U.S. PATENT DOCUMENTS

| | | | |
|---|---|---|---|
| 7,525,125 B2* | 4/2009 | Ahn et al. | 257/89 |
| 7,580,095 B2 | 8/2009 | Okumoto et al. | |
| 7,812,345 B2 | 10/2010 | Yoshida et al. | |
| 2001/0054868 A1 | 12/2001 | Okuyama et al. | |
| 2004/0009303 A1 | 1/2004 | Ito et al. | |
| 2005/0212413 A1 | 9/2005 | Matsuura et al. | |
| 2006/0061266 A1* | 3/2006 | Kang et al. | 313/504 |
| 2006/0061268 A1 | 3/2006 | Nakanishi | |
| 2006/0082721 A1 | 4/2006 | Okumoto et al. | |
| 2006/0186825 A1 | 8/2006 | Nakanishi | |
| 2008/0079361 A1 | 4/2008 | Nakanishi | |
| 2008/0224963 A1 | 9/2008 | Takagi et al. | |
| 2009/0068351 A1 | 3/2009 | Ito et al. | |
| 2009/0206752 A1 | 8/2009 | Nakanishi | |
| 2009/0246356 A1 | 10/2009 | Higashida et al. | |
| 2009/0284141 A1 | 11/2009 | Sakanoue et al. | |
| 2010/0102310 A1 | 4/2010 | Komatsu et al. | |
| 2010/0213827 A1 | 8/2010 | Yoshida et al. | |
| 2010/0258833 A1 | 10/2010 | Okumoto et al. | |

FOREIGN PATENT DOCUMENTS

| | | |
|---|---|---|
| JP | 8-271720 | 10/1996 |
| JP | 10-255975 | 9/1998 |
| JP | 11-326625 | 11/1999 |
| JP | 2002-008871 | 1/2002 |
| JP | 2003-270422 | 9/2003 |

(Continued)

OTHER PUBLICATIONS

International Search Report of PCT/JP2009/006026, dated Dec. 15, 2009.

(Continued)

*Primary Examiner* — Brook Kebede
(74) *Attorney, Agent, or Firm* — Greenblum & Bernstein, P.L.C.

(57) ABSTRACT

An organic luminescence includes pixel electrodes. Banks are each generally between adjacent ones of the pixel electrodes. The banks define apertures that each correspond to one of the pixel electrodes. An organic luminescent layer is within each of the apertures, and an upper electrode is above the banks and the organic luminescent layer. At least a portion of a periphery of each of the apertures includes curved portions and cusps. The curved portions are concave, and adjacent ones of the curved portions define each of the cusps.

15 Claims, 7 Drawing Sheets

FOREIGN PATENT DOCUMENTS

| | | |
|---|---|---|
| JP | 2005-242383 | 9/2005 |
| JP | 2005-268062 | 9/2005 |
| JP | 2006-075746 | 3/2006 |
| JP | 2006-119270 | 5/2006 |
| JP | 3800182 | 5/2006 |
| JP | 2007-171858 | 7/2007 |
| JP | 2008-234929 | 2/2008 |
| JP | 2008-226747 | 9/2008 |
| JP | 2009-245816 | 10/2009 |

OTHER PUBLICATIONS

Written Opinion of PCT/JP2009/006026, dated Dec. 15, 2009.
U.S. Appl. No. 12/916,944 to Okumoto et al., filed Nov. 1, 2010.
U.S. Appl. No. 12/908,424 to Miyazawa, filed Oct. 20, 2010.

* cited by examiner

ORGANIC ELECTROLUMINESCENCE ELEMENT AND MANUFACTURING METHOD THEREOF

CROSS REFERENCE TO RELATED APPLICATION

This is a continuation application of PCT Application No. PCT/JP2009/006026, filed on Nov. 11, 2009, designating the United States of America, the disclosure of which, including the specification, drawings, and claims, is incorporated herein by reference in its entirety.

BACKGROUND OF THE INVENTION

1. Field of the Invention

The present invention relates to an organic electroluminescence (hereafter referred to as organic EL) element and a manufacturing method thereof.

2. Description of the Related Art

Organic EL display devices are luminescence display devices which utilize electric field luminescence phenomenon of an organic compound, and are being put into practical use as compact display devices used in cellular phones and so on.

An organic EL display device is configured by placing organic EL elements in an array, on a substrate. Such organic EL elements allow independent luminescence-production control on a per pixel basis. A typical organic EL display device is manufactured by stacking, on a substrate, a driving circuit, an anode, a luminescence function layer, and a cathode. In the luminescence function layer, one or more of function layers, such as an electron injection layer, an electron transport layer, a hole transport layer, a hole injection layer, and so on, are stacked together with an organic luminescent layer made from an organic compound.

In such a configuration, electric charges are injected to the organic luminescent layer from the anode and the electrode via the hole transport layer, and production of luminescence occurs due to the recoupling of the injected electric charges within the organic luminescent layer.

As an example, the organic EL elements for the respective pixels in the organic EL display device are configured by: providing pixel electrodes (for example, anodes) separated on a per-pixel basis on a substrate; placing a bank which is made from an insulating material and includes apertures each corresponding to one of the pixel electrodes; and forming the luminescence function layer in the apertures of the bank.

The luminescence function layer (particularly, the organic luminescent layer) can be formed though the application and hardening of a functional fluid (ink) including an organic compound having an electric field luminescence-producing function, in the respective apertures of the bank.

When forming the luminescence function layer using a method of applying and hardening ink in the apertures of the bank, it is important that the ink, which becomes the functional film, spreads throughout (in other words, fills) the respective apertures.

If the ink is not sufficiently spread throughout the respective apertures, uneven thickness or breaks appear in the resulting functional film, and thus trouble such as uneven luminescence production or short-circuiting defects occurs in the organic EL device.

Consequently, a well known measure for improving the fillability of ink is a technique in which, in an organic EL display device, the contour of the apertures into which ink is applied is shaped to have beveled corners (for example, patent reference 1: Japanese Unexamined Patent Application Publication No. 2006-119270).

Shaping the contour of the apertures of the bank to have beveled corners makes it easier for the ink, which becomes the luminescent layer, to spread up to every corner of the respective apertures. As a result, the luminescent layer is formed with the desired thickness throughout the entirety of the respective apertures of the bank, and the occurrence of uneven luminescence production or short-circuiting defects is reduced.

SUMMARY OF THE INVENTION

However, in the organic EL display device, a main substrate on which the organic EL elements are provided is completed by being sealed using a sealing substrate. The sealing substrate includes minute projections called photo spacers in positions corresponding to the bank on the main substrate, and is held in place with a desired distance maintained from the main substrate, by the abutting of the photo spacers against the main substrate at the positions corresponding to the bank.

There is a demand for ensuring that the bank provided on the main substrate in such a configuration has the necessary mechanical strength as a footing on which photo spacers are to stand.

However, there is the problem that the shape, in which the corners of the apertures are beveled in order to ensure ink fillability, is not necessarily sufficient to meet the demand for ensuring the mechanical strength of the bank.

In order to ensure the mechanical strength of the bank, it is possible to consider a method of increasing the installation area of the bank by widening the bank width, and so on. However, with this method, there is the problem that the aperture ratio of the pixels decreases by the amount at which the installation area of the bank is increased.

The present invention is conceived in view of the aforementioned circumstances and has as an object to provide, in an organic EL element having an organic luminescent layer formed by the application and hardening of ink in the aperture of the bank, a bank shape that has improved mechanical strength over the prior art, while ensuring ink fillability throughout the entirety of the respective apertures at a level comparable to the prior art, and high pixel-aperture-ratio comparable to that of the prior art.

In order to solve the aforementioned problem, the organic electroluminescence element according to the present invention is an organic electroluminescence (EL) element including: pixel electrodes; a bank which is placed between adjacent ones of the pixel electrodes and includes apertures each of which corresponds to one of the pixel electrodes; an organic luminescent layer which is placed within each of the apertures; and an upper electrode which is placed above the bank and the organic luminescent layer, wherein a shape of a part of a contour of each of the apertures is a shape that includes curves and cusps, the curves bulging inwards of the aperture, and the cusps each being a connection point of adjacent ones of the curves.

In the present invention, since a part of the contour of each of the apertures is of a shape that includes curves, which bulge inwards of the aperture, and cusps, each of which is a connection point of adjacent curves, the mechanical strength (particularly the collapse strength) of the bank improves, and is particularly suitable for when the bank is used as a footing of photo spacers.

Furthermore, the ink fillability throughout the entirety of the respective apertures in the present invention is excellent to a comparable level as that in the conventional beveled shape, and with regard to pixel-aperture-ratio, it is possible to ensure a high aperture ratio that is comparable to that of the conventional beveled shape.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

Figure 1:
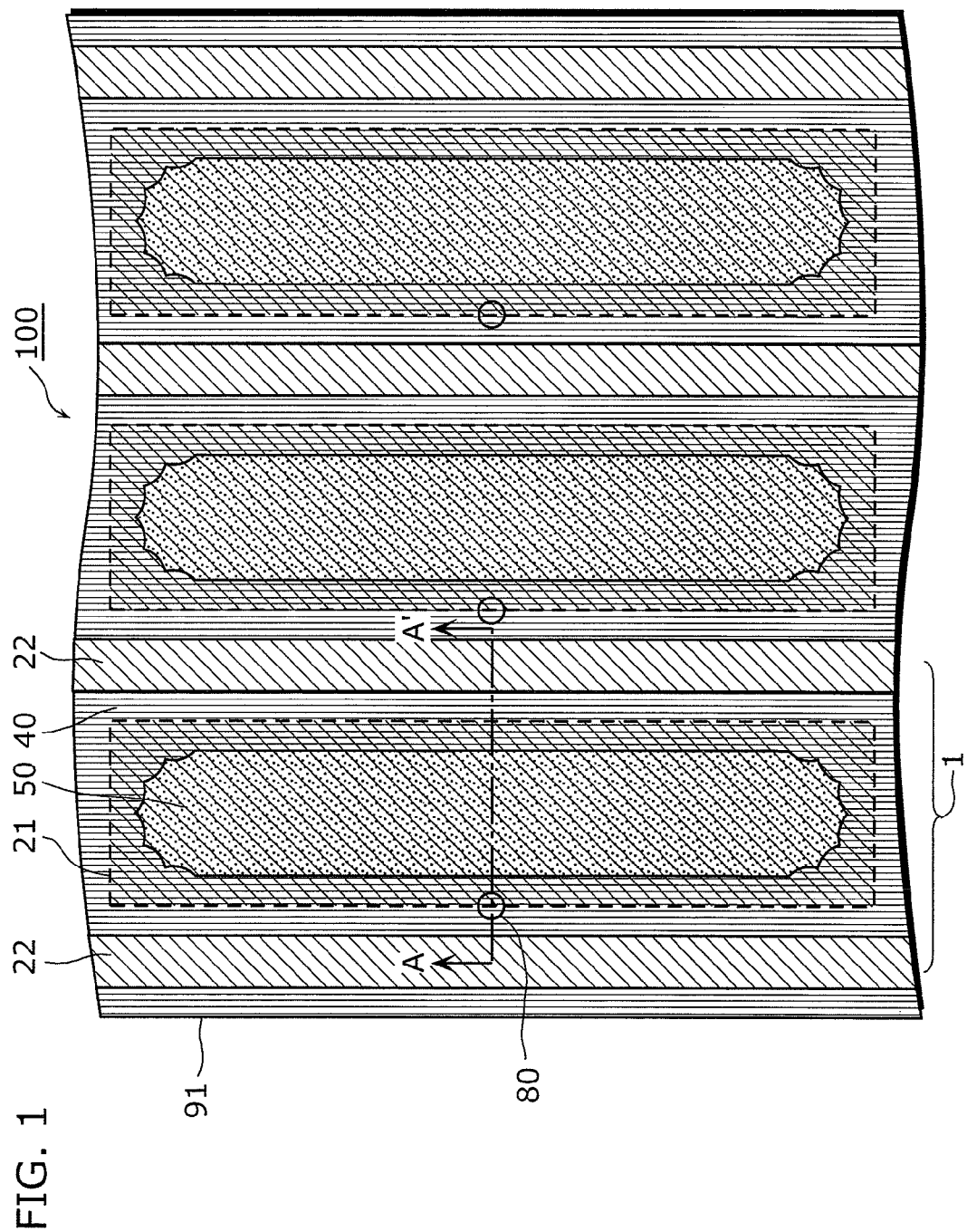
FIG. 1 is a plan view showing an example of the structure of an organic EL element in an embodiment.

In one implementation, the organic electroluminescence element according to the present invention includes: pixel electrodes; a bank which is placed between adjacent ones of the pixel electrodes and includes apertures each of which corresponds to one of the pixel electrodes; an organic luminescent layer which is placed within each of the apertures; and an upper electrode which is placed above the bank and the organic luminescent layer, wherein a shape of a part of a contour of each of the aperture, and the cusps each being a connection point of adjacent ones of the curves.

The present invention is characterized in that the respective apertures of the bank into which ink is applied are of a shape that is defined by a contour including curves bulging inwards of the aperture and cusps each of which is a connection point of adjacent curves. Such contour shape of the apertures enables the improvement of the mechanical strength (particularly, the collapse strength) of the bank, as described later. Furthermore, with such a contour shape of the apertures in the present invention, it is possible to demonstrate excellent properties for ink fillability and pixel-aperture-ratio comparable to those of the conventional beveled shape.

Furthermore, in an implementation of the organic luminescence element according to the present invention, it is preferable that an overall shape of the contour be one of (i) a rough oval shape which includes two opposing straight-line parts and two rough-curve parts each connecting corresponding ends of the straight-line parts, and (ii) a rough-rectangular shape which includes a total of four straight-line parts in two opposing pairs, and four rough-curve parts connecting adjacent ends of the straight-line parts, and that the shape of the part of the contour be a shape of the rough-curve parts Furthermore, in an implementation of the organic luminescence element according to the present invention, each of the curves may be a circular arc or an elliptic arc, and the number of the cusps may range from 6 to 1000. It is more preferable that the number of the cusps range from 30 to 1000. According to this implementation, fillability of ink can be controlled by providing more cusps.

Furthermore, in an implementation of the organic luminescence element according to the present invention, it is preferable that a connection angle, which is an angle formed between respective tangents to two of the curves at each of the cusps, be 90 degrees or greater. This connection angle can also be controlled by changing the curvature of the curves to be used.

Furthermore, in an implementation of the organic luminescence element according to the present invention, the organic luminescent layer may be formed through hardening of ink.

According to this implementation, the organic luminescent layer is formed by the hardening of ink, and is thus suitable in the manufacturing of large-size organic EL display devices.

Furthermore, in an implementation of the organic luminescence element according to the present invention, a sealing layer provided with projections may be further included, wherein each of the projections abuts against a part corresponding to an apex-part of the bank.

Since the mechanical strength of the bank is improved in the present invention, the adoption of this implementation particularly enables the advantageous effect of the present invention to be effectively demonstrated.

It should be noted that the present invention can be implemented, not only as an organic EL element such as that described above, but also as manufacturing method of the organic EL element, and as an organic EL display device configured by setting organic EL elements in an array.

Hereinafter, an organic EL element and an organic EL display device according to an embodiment of the present invention shall be described with reference to the Drawings.
(Organic EL Display Device)

FIG. 1 is a plan view showing an example of the structure of an organic EL display device 100 in the embodiment of the present invention. FIG. 1 shows a part of the organic EL display device 100, which includes three of organic EL elements 1. Such a configuration is provided throughout the entirety of the organic EL display device 100 by being repeated in the left-right and up-down directions of the diagram.

Figure 2:
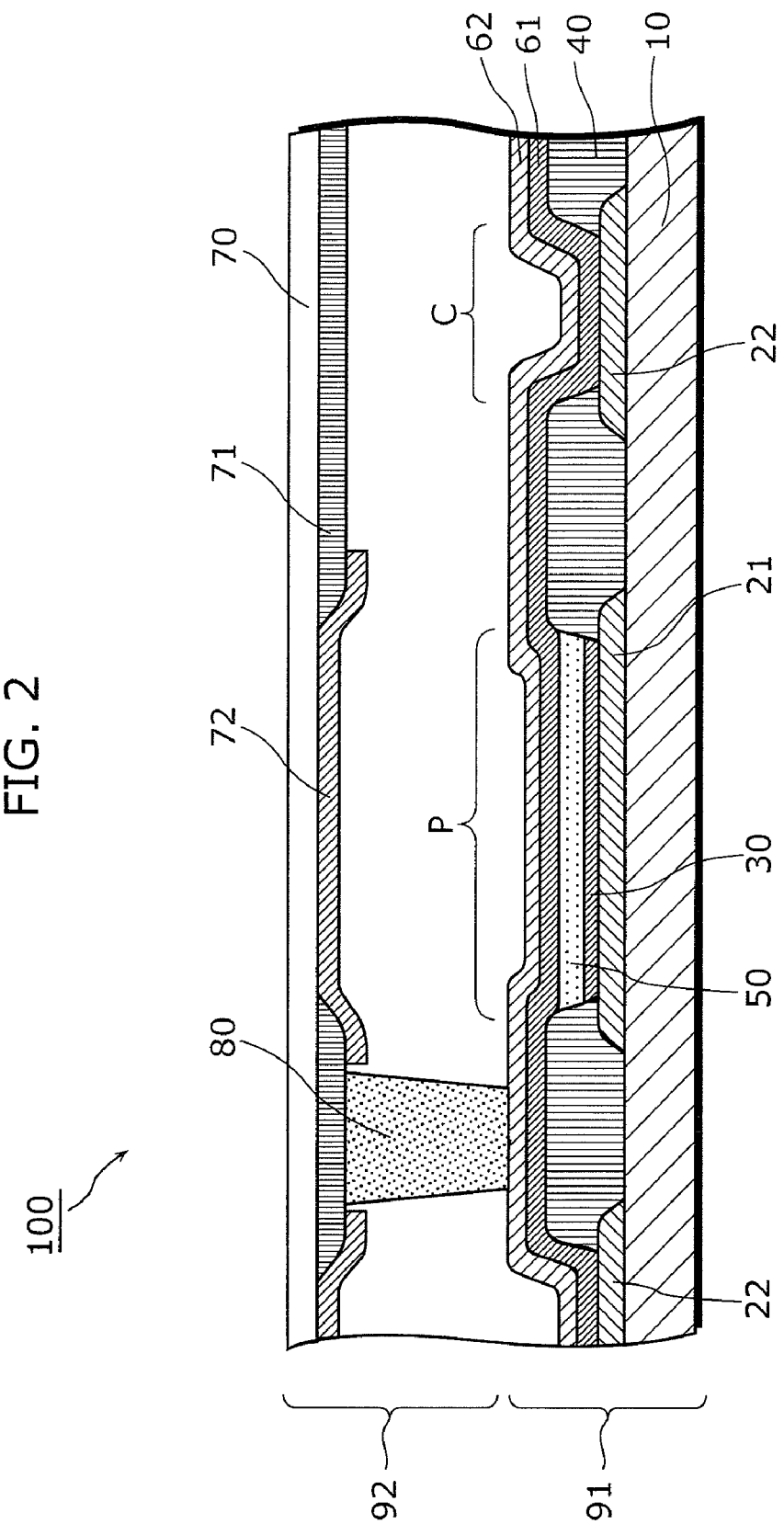
FIG. 2 is a cross-sectional view showing an example of the structure of the organic EL element in the embodiment.

FIG. 2 is a cross-sectional diagram showing a cross-section of the organic EL display device 100 along line AA' shown in FIG. 1. FIG. 2 shows the cross-sectional structure of one organic EL element.

In FIG. 1 and FIG. 2, identical constituent elements are represented with the same hatching pattern. FIG. 1 shows the planar arrangement of the main constituent elements shown in FIG. 2.

It should be noted that FIG. 1 and FIG. 2 are schematic diagrams for description purposes, and that the sizes of the respective parts are rendered with arbitrary sizing proportions.

In general terms, the organic EL display device 100 is configured by sealing a main substrate 91 on which the organic EL elements 1 are formed, using a sealing substrate 92. A color filter may or may not be provided on the bottom surface or the top surface of the sealing substrate 92.

The main substrate 91 includes: a substrate 10, pixel electrodes 21 each of which is provided, as an anode, on the top surface of the substrate 10 and corresponds to one of the organic EL elements 1; supplementary electrodes 22 each of which is formed separate from the pixel electrodes 21 and supplements the power supply to an upper electrode 62; a hole injection layer 30 which is made from a material having a hole-transporting property; a bank 40 which is made from a material having an electrical insulating property such as a photosensitive resin and which compartmentalizes the pixels; an organic luminescent layer 50 which is made from an organic material having an electric field luminescence-producing function; an electron transport layer 61 which is made from a material having an electron-transporting property; and the upper electrode 62 which is made from a conductive material and is used as a cathode.

As can be seen in FIG. 2, in the bank 40, an aperture is provided above each of the pixel electrodes 21 and the supplementary electrodes 22. For the sake of convenience, the aperture above a pixel electrode 21 shall be called a pixel aperture P, and the aperture above a supplementary electrode 22 shall be called a connection aperture C. The organic luminescent layer 50 is formed within the pixel aperture P, and the supplementary electrode 22 and the upper electrode 62 are electrically connected in the connection aperture C via the electron transport layer 61. The electron transport layer 61 and the upper electrode 62 may be formed as continuous films that are not separated on a per pixel basis.

The sealing substrate 92 is bonded together with the main substrate 91 after being fabricated separately from the main substrate 91, and includes: a substrate 70; a light-shielding film 71 provided on the substrate 70 except in areas corresponding to the pixel apertures P; a color filter film 72 provided on the parts without the light-shielding film 71; and photo spacers 80 which are provided in positions on the light-shielding film 71 that correspond to the bank 40.

The sealing substrate 92 is held in place with a desired distance maintained from the main substrate 91, by the abutting of the photo spacers 80 against corresponding apex parts of the bank 40 of the main substrate 91.

It should be noted that although, for ease of description, a photo spacer 80 is shown in the cross-section in FIG. 2 in such a way that the photo spacer 80 is provided between pixel apertures P which are adjacent in the horizontal direction of the diagram, the positioning of the photo spacer 80 on the bank 40 is arbitrary. For example, the photo spacer 80 may be provided on an apex part of the bank 40 between pixel apertures P outside the diagram which are adjacent in the vertical direction of the diagram.

(Details of the Shape of the Apertures Provided on the Bank)

Detailed description regarding the shape of the pixel apertures P provided on the bank 40 shall be continued.

Figure 3:
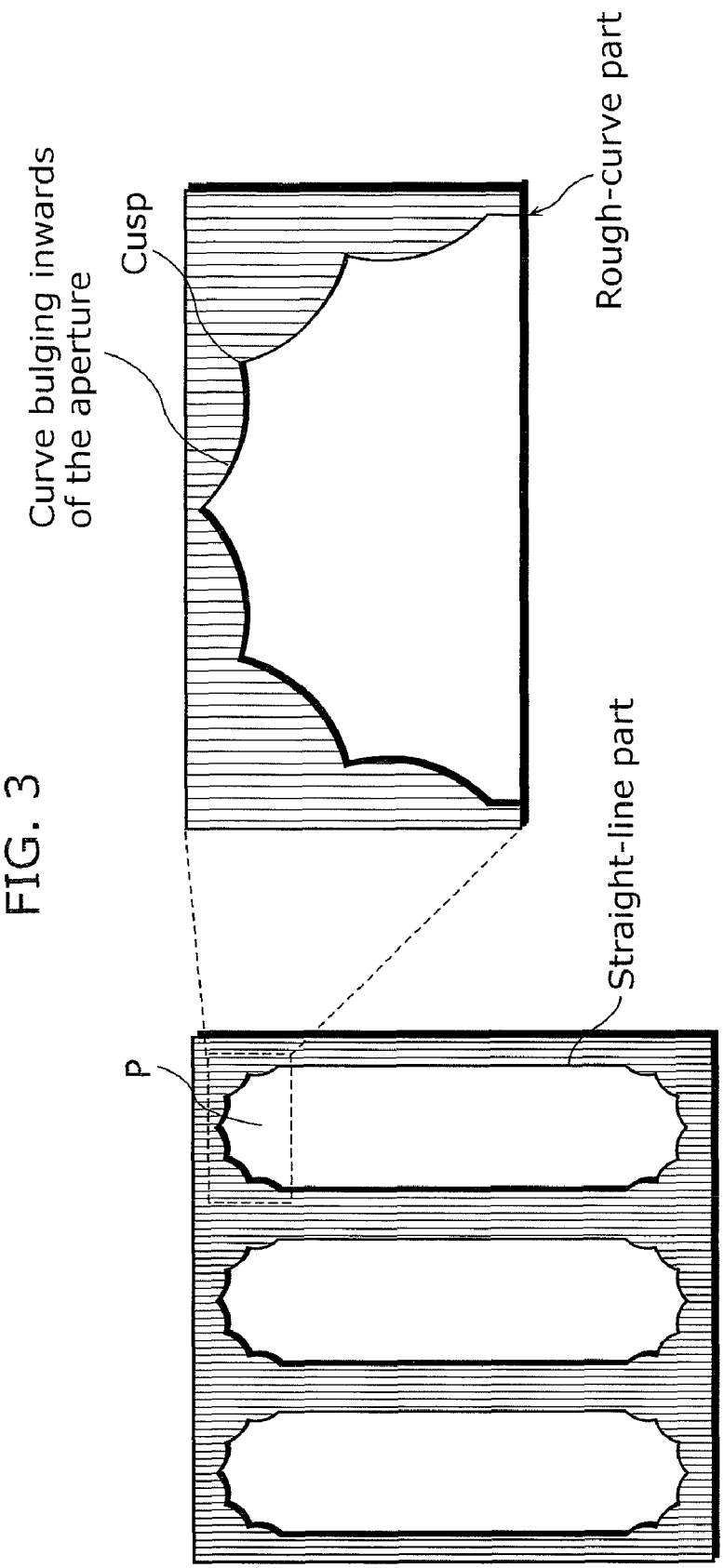
FIG. 3 is a plan view showing an example of the shape of a pixel aperture in the embodiment.
Figure 4:
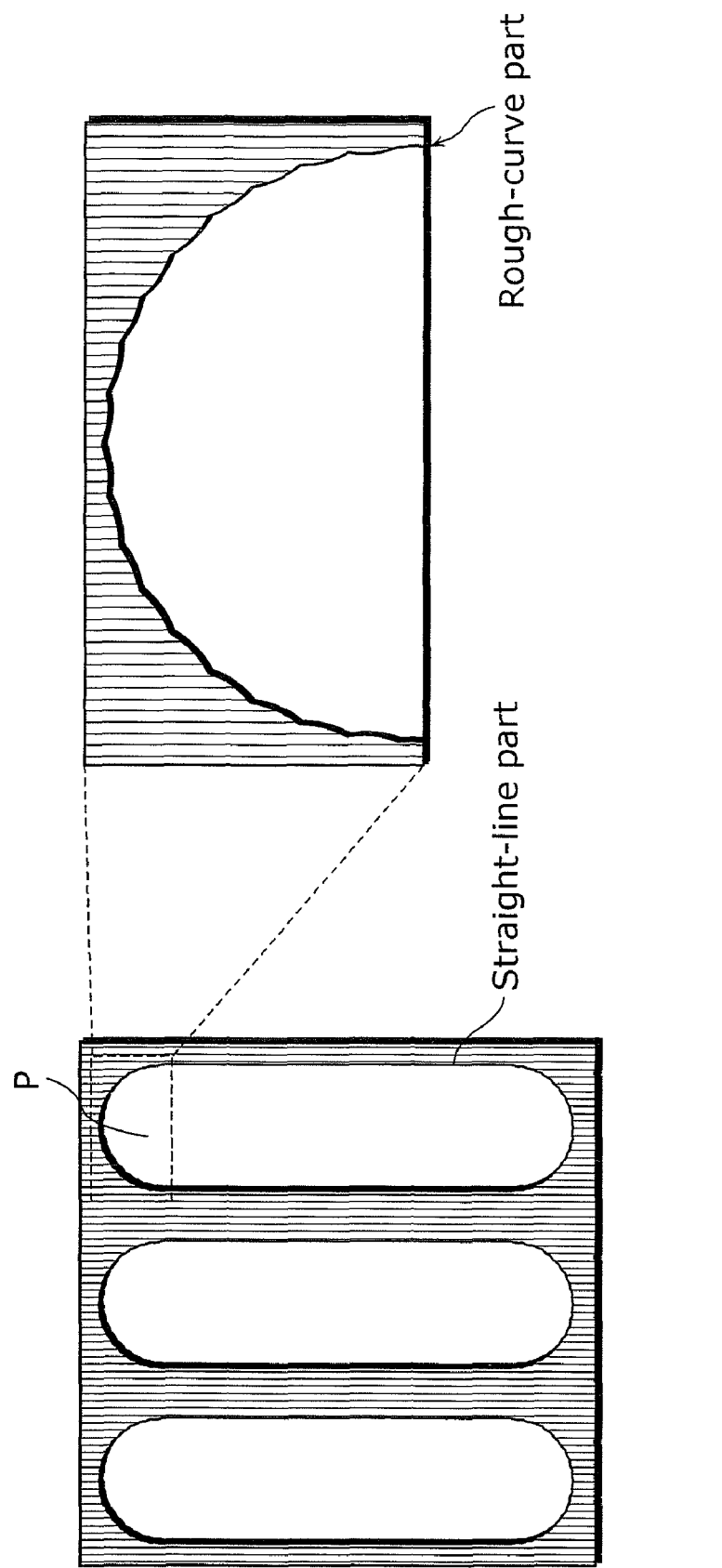
FIG. 4 is a plan view showing another example of the shape of a pixel aperture in the embodiment.

FIG. 3 and FIG. 4 are magnified plane views showing an example of the shape of the pixel apertures P of the bank 40, together with a magnified view of an end part including a rough-curve part. It should be noted that in FIG. 3 and FIG. 4, illustration of the connection apertures C is omitted.

As shown in FIG. 3 and FIG. 4, the respective pixel apertures P of the bank 40 in an implementation of the present invention is formed such that the shape of a part of the contour thereof is, in a planar view, a shape that includes curves which bulge inwards of the aperture and cusps each of which is a connection point of adjacent curves. It is preferable that each of the curves is a circular arc or an elliptic arc.

Furthermore, as shown in FIG. 3 and FIG. 4, it is preferable that the overall shape of the contour of the pixel aperture P is a rough oval. The rough oval referred to here is a shape which includes two opposing straight-line parts and two rough-curve parts which connect the corresponding ends of the straight-line parts, as shown in FIG. 3 and FIG. 4. When the overall shape of the contour of the pixel aperture P is a rough oval, the shape of each of the two rough-curve parts connecting the corresponding ends of the straight-line parts is con-figured of a shape which includes curves which bulge inwards of the aperture and cusps each of which is a connection point of adjacent curves. As is clear from FIG. 4, although the respective rough-curve parts in this form appear to be a single circular arc-shape when the number of the cusps is relatively large, it can be seen, when the rough-curve part is viewed under magnification, that the rough-curve part is configured of a shape that includes a plurality of curves which bulge inwards of the aperture and cusps each of which is a connection point of adjacent curves Furthermore, the overall shape of the contour of the pixel aperture P can also be roughly-rectangular. The roughly-rectangular shape referred to here is a shape which includes a total of four straight-line parts in two opposing pairs and four rough-curve parts which connect the ends of the straight-line parts. When the overall shape of the contour of the pixel aperture P is roughly-rectangular, the shape of each of the four rough-curve parts connecting the ends of the straight-line parts is configured of a shape which includes curves which bulge inwards of the aperture and cusps each of which is a connection point of adjacent curves.

In the example shown in FIG. 3, out of the contour of the pixel aperture P, each of the rough-curve parts, which is configured of a shape including curves which bulge inwards of the aperture and cusps each of which is a connection point of adjacent curves, is configured of a shape in which each of six sides making up half an equilateral dodecagon is replaced with a circular arc which bulges inwards of the aperture.

In the example shown in FIG. 4, out of the contour of the pixel aperture P, each of the rough-curve parts, which is configured of a shape including curves which bulge inwards of the aperture and cusps each of which is a connection point of adjacent curves, is configured of a shape in which each of 18 sides making up half an equilateral triacontakaihexagon is replaced with a circular arc which bulges inwards of the aperture.

In either of the examples, with the shape of the bank aperture in an implementation of the present invention, the mechanical strength (particularly the collapse strength) of the bank is improved as compared to the conventional beveled shape of the corners of the simple bank aperture for improving ink fillability.

Figure 5:
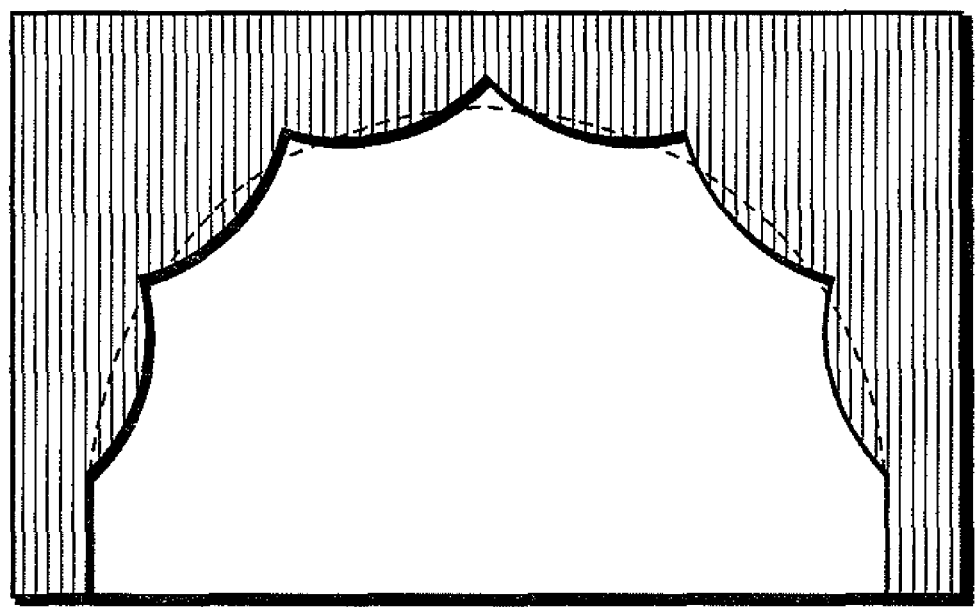
FIG. 5 is a plan view showing a comparison of the shapes of a part of a pixel aperture in the embodiment and the prior art.

In the present invention, as shown by the solid line in FIG. 5, a part of the contour of the pixel aperture P is configured of a shape specific to the present invention, which includes curves which bulge inwards of the aperture and cusps each of which is a connection point of adjacent curves.

As is also clear from FIG. 5, the shape specific to the present invention includes a plurality of curves which bulge inwards of the aperture, and thus the sum of the lengths of the respective curves is longer compared to the length of the part of the aperture formed by the conventional simple circular arc shown by the broken line in FIG. 5.

In the present invention, since the contour of the pixel aperture P becomes longer than the contour of the conventional aperture, the weight of the sealing substrate, and so on, bearing down on the bank is dispersed in accordance with the percentage by which the contour becomes longer. As a result, the mechanical strength, particularly the collapse strength, of the bank is improved. Furthermore, in the case of an aperture formed by the conventional simple circular arc for example, since the contour as viewed from the point at which force is applied becomes an approximate straight line, the distance from the point at which force is applied changes between the central part and an end, and thus localized force is generated. In the present invention, since the contour as viewed from the point at which force is applied becomes a circular arc, the distances from the point at which force is applied becomes approximately equal. Specifically, localized force is not generated as force is evenly dispersed, and as a result, collapse strength is improved.

With the shape specific to the present invention, it is possible to attain an aperture area comparable to that of the aperture formed by the conventional simple circular arc and attain a pixel-aperture-ratio comparable to that which is conventional, by appropriately adjusting the number of the curves or the curvature of the curves.

In other words, in the present invention, it is possible to improve the mechanical strength of the bank while maintaining a pixel-aperture ratio that is comparable to that of the prior art.

In addition, in the present invention, ink fillability can be controlled by appropriately adjusting the connecting angle, which is the angle formed between the respective tangents to two curves at a cusp, by changing the number of the cusps provided and the curvature of the curves to be used. Although the connecting angle is an item that should be adjusted depending on the viscosity of the ink, in the case where the viscosity of the ink is for example 20 to 30 cps, it is preferable that the connecting angle be greater than 90 degrees in view of the conventional beveling of the corners (90 degrees) of the rectangular aperture for the sake of ink fillability. Furthermore, the connecting angle may be 135 degrees or greater, for example, considering that a 135-degree angle is formed by two adjacent sides in the shape in which the corners of an end part are beveled by a straight line.

In this manner, in the present invention, by appropriately adjusting the connecting angle which is the angle formed between the respective tangents to two curves at a cusp, the ink can be spread throughout every corner of the aperture, and thus it is possible to ensure excellent ink fillability comparable to that of the aperture shape that is formed by the conventional simple arc.

As described thus far, in the present invention, it is possible to improve the mechanical strength of the bank while maintaining ink fillability and a pixel-aperture-ratio that are comparable to those in the prior art.

(Manufacturing Method of a Display Device)

Next, the method for manufacturing a display device according to an implementation of the present invention shall be described. The method for manufacturing a display device according to an implementation of the present invention is characterized by including a process of forming a bank including pixel apertures having the above-described shape.

Hereinafter, the method of manufacturing a display device according to an embodiment of the present invention shall be described in detail with reference to the Drawings.

FIG. 6 shows process cross-sectional views describing an example of a method of manufacturing the organic EL display device 100 in the embodiment of the present invention.

It should be noted that, since the respective processes to be described hereafter can be implemented using well known processing technologies, detailed description regarding process conditions, and so on, shall be omitted as appropriate. Furthermore, the respective materials and processes indicated below are typical examples and are not intended to limit the display device and the manufacturing method thereof in the present invention. The present invention also includes cases of substitution with other materials and processes of known adequacy.

First, an aluminum-based metal film (hereafter called Al film) is formed on the entirety of the substrate 10, using for example vacuum vapor deposition or sputtering. Subsequently, by etching the Al film using photolithography, the pixel electrodes 21 are formed at the desired positions and the supplementary electrodes 22 are formed at positions that are electrically insulated from the pixel electrodes 21.

At this time, the pixel electrodes 21 are formed by being separated on a per organic EL element basis, and the supplementary electrodes 22 are formed by being arranged one-dimensionally along, for example, the rows or the columns of the organic EL elements which are arrayed in a two-dimensional matrix.

It should be noted that a driving circuit (not illustrated) consisting of, for example, thin-film transistors or capacitors, may be formed in advance in the substrate 10. In order to resolve the unevenness caused by the driving circuit and so on, a flattening film may be provided as necessary, and the pixel electrodes 21 and the supplementary electrodes 22 may be formed thereon.

Next, a negative-type photoresist 40A, which becomes the bank 40, is applied throughout.

Next, a mask 40M having light-shielding parts in positions corresponding to the pixel apertures P and the connection apertures C is positioned and placed on the negative-type photoresist 40A. Subsequently, the photoresist 40A is exposed, via the mask 40M, using photolithography. The characteristic shape described earlier for forming the pixel apertures P of the bank 40 is utilized in the mask 40M.

Figure 6A:
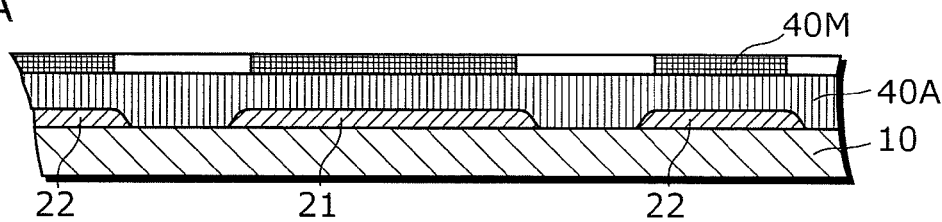
FIG. 6A to FIG. 6F are cross-sectional views showing the manufacturing process of the organic EL element in the embodiment.

With the processes described up to this point, the structure shown in FIG. 6A is fabricated.

Next, the bank 40 including the pixel apertures P and the connection apertures C is formed by removing the mask 40M and performing developing.

Figure 6B:
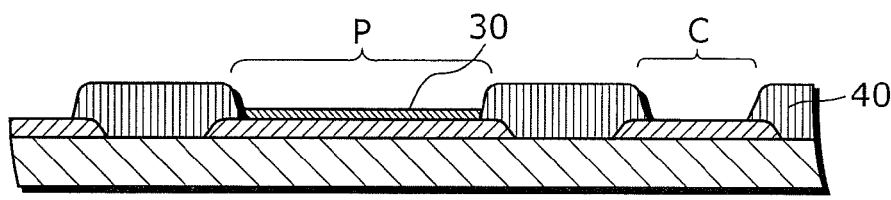

With the processes up to this point, the structure shown in FIG. 6B is fabricated. Next, inside the respective pixel apertures P, polyethylene dioxythiophene (PEDOT) for example, is placed using an ink-jet method for example, in order to form the hole injection layer 30. In addition, ink 50A, which becomes the organic luminescent layer 50 is applied using the ink-jet method for example. At this time, the ink 50A is applied in such a way that it is raised from the pixel aperture P due to surface tension, and fills the pixel aperture P. As an example, the viscosity of the ink 50A is 20 to 30 cps.

Figure 6C:
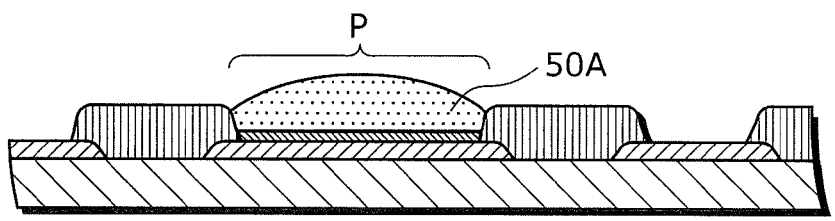

With the processes up to this point, the structure shown in FIG. 6C is fabricated.

Next, the organic luminescent layer 50 is formed by hardening the ink 50A by vaporizing the solvent component of the ink 50A by, for example, drying the ink 50A for approximately 30 minutes at 80° C. It should be noted that when the organic EL element shown in FIG. 1 is to be provided to each of sub-pixels having different luminescent colors such as red, green, and blue, an organic EL element 1, within which is formed an organic luminescent layer of a different luminescent color for each sub-pixel, is formed by repeating the application and hardening of an ink including an organic luminescent material corresponding to a different luminescent color, in the pixel aperture P of the respective organic EL elements 1.

Figure 6D:
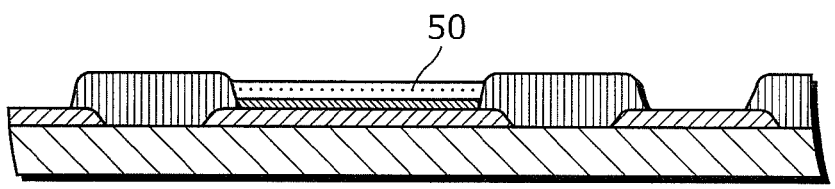

With the processes up to this point, the structure shown in FIG. 6D is fabricated.

Next, using vacuum vapor deposition for example, the electron transport layer 61 is formed throughout so as to cover at least the pixel apertures P and the connection apertures C. Subsequently, the upper electrode 61 is formed throughout by forming a film of, for example, indium tin oxide, on the electron transport layer 61. With this, the upper electrode 62 and the supplementary electrode 22 are electrically connected in the respective connection apertures C via the electron transport layer 61.

Figure 6E:
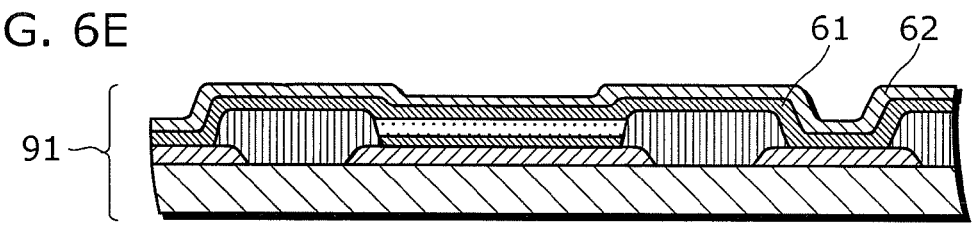

With the processes up to this point, the main substrate 91 shown in FIG. 6E is completed.

The sealing substrate is fabricated independently of these processes.

First, the light-shielding film 71 is formed on the substrate 70 in areas other than areas corresponding to the pixel apertures P, using the ink-jet method for example.

Next, using photolithography for example, the color filter film 72 is formed so as to cover the areas on the substrate 70 on which the light-shielding film 71 is not formed.

Next, a negative-type photoresist is applied throughout, and the photo spacers 80 are formed in positions corresponding to the bank 40 using photolithography.

The sealing substrate 92 fabricated in such manner are bonded with the main substrate 91 by positioning the sealing substrate 92 so that the photo spacers 80 abut against the corresponding bank 40 of the main substrate 91.

Figure 6F:
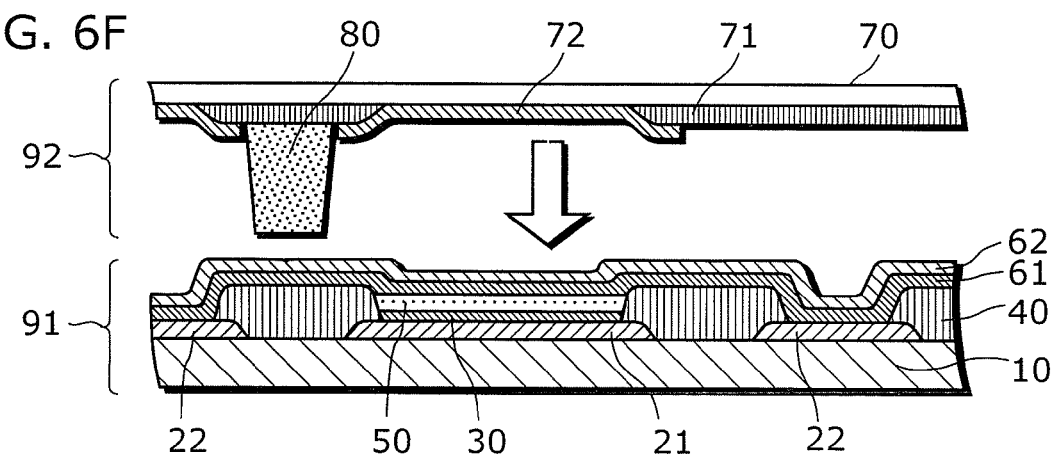

After the above-described processes, the organic EL display device 100 shown in FIG. 6F is completed.

(Example for the Use of the Organic EL Display Device)

The organic EL display device is used, for example, as a display device of a television set and the like.

Figure 7:
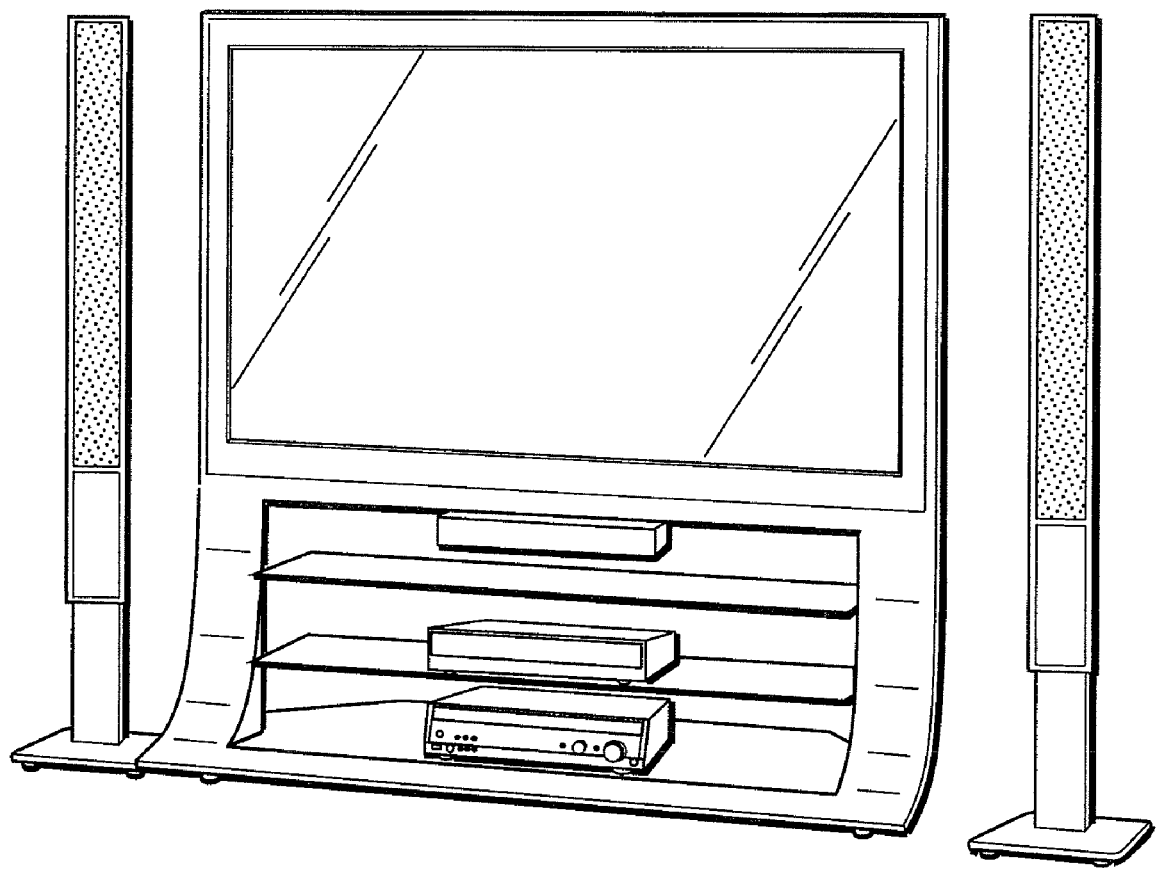
FIG. 7 is an outline view of a television set using an organic EL display device.

FIG. 7 is an outline view of a television set as an example of a display device using the organic EL display device 100.

Aside from such a television set, the organic EL display device 100 can also be used as various display devices such as mobile phones, personal computers, and so on.

Although the organic EL element and the organic EL display device using the organic EL element according to the present invention have been described based on an embodiment, the present invention is not limited to such embodiment. As long as they do not depart from the essence of the present invention, various modifications to the present embodiment which may be conceived by those skilled in the art are intended to be included within the scope of this invention.

For example, although a configuration using the pixel electrodes 21 as anodes and using the upper electrode 62 as a cathode is exemplified in the embodiment, the pixel electrodes 21 may be used as cathodes and the upper electrode 62 may be used as an anode. In such case, the electron transport layer 61 is placed lower than the organic luminescent layer 50 and the hole injection unit 30 is placed higher than the organic luminescent layer 50.

Furthermore, although the a stacked structure of the hole injection layer 30, the organic luminescent layer 50, and the electron transport layer 61 is exemplified as the luminescence function layer in the embodiment, the luminescence function layer is not limited to such a configuration. For example, a commonly-known stacked structure made up of the five layers of a hole injection layer, a hole transport layer, an organic luminescent layer, an electron transport layer, and an electron injection layer may also be used as a luminescence function layer. It should be noted that the four layers other than the organic luminescent layer are provided, as appropriate, in order to achieve excellent luminescence capability in the organic EL element, and may be omitted. Specifically, it is possible to have a configuration in which one or both of the hole injection layer 30 and the electron transport layer 61 are not provided.

Although only one exemplary embodiment of this invention has been described in detail above, those skilled in the art will readily appreciate that many modifications are possible in the exemplary embodiment without materially departing from the novel teachings and advantages of this invention. Accordingly, all such modifications are intended to be included within the scope of this invention.

INDUSTRIAL APPLICABILITY

The organic EL display device according to an implementation of the present invention can be used as various display devices such as a television set, a mobile phone, a personal computer, and so on.

What is claimed is:

1. An organic electroluminescence element, comprising:
   pixel electrodes;
   a bank generally located between adjacent ones of the pixel electrodes, the bank defining apertures that each correspond to one of the pixel electrodes;
   an organic luminescent layer within each of the apertures; and
   an upper electrode above the bank and the organic luminescent layer,
   wherein at least a portion of a periphery of each of the apertures includes curved portions and cusps, the curved portions are concave, and connection points of adjacent ones of the curved portions define each of the cusps.

2. The organic electroluminescence element according to claim 1,
   wherein the periphery of each of the apertures is a generally rounded and elongated rectangle that includes two generally straight sides interconnected by two generally curved sides, and
   the two generally curved sides each include the curved portions and the cusps.

3. The organic electroluminescence element according to claim 1,
   wherein the periphery of each of the apertures is a generally rounded rectangle that includes four straight sides interconnected with four generally curved corners, and
   the four generally curved corners each include the curved portions and the cusps.

4. The organic electroluminescence element according to claim 1, wherein each of the curved portions is a circular arc.

5. The organic electroluminescence element according to claim 1, wherein each of the curved portions is an elliptic arc.

6. The organic electroluminescence element according to claim 1, wherein a number of the cusps ranges from 6 to 1000.

7. The organic electroluminescence element according to claim 1, wherein a connection angle, which is an angle formed between respective tangents of the adjacent ones of the curved portions at each of the cusps, is at least 90 degrees.

8. The organic electroluminescence element according to claim 1, wherein the organic luminescent layer is hardened ink.

9. The organic electroluminescence element according to claim 1, further comprising:
   a sealing layer provided with projections that each correspond to an apex of one of the banks.

10. The organic electroluminescence element according to claim 1, the bank comprising a plurality of banks.

11. A method of manufacturing an organic electroluminescence element, comprising:
    forming pixel electrodes;
    forming, generally between adjacent ones of the pixel electrodes, a bank that defines apertures that each correspond to one of the pixel electrodes;
    forming an organic luminescent layer within each of the apertures; and
    forming an upper electrode above the bank and the organic luminescent layer,
    wherein the bank is formed such that at least a portion of a periphery of each of the apertures includes curved portions and cusps, the curved portions are concave, and connection points of adjacent ones of the curved portions define each of the cusps.

12. The method of manufacturing an organic electroluminescence element according to claim 11, wherein the bank is formed by photolithography using a negative-type photosensitive material.

13. The method of manufacturing an organic electroluminescence element according to claim 11, wherein the organic luminescent layer is formed by hardening ink.

14. The method of manufacturing an organic electroluminescence element according to claim 13, wherein a viscosity of the ink ranges from 20 to 30 cps.

15. The method of manufacturing an organic electroluminesceent according to claim 11, the forming a bank comprising forming a plurality of banks.

* * * * *